United States Patent
Ogawa et al.

(10) Patent No.: US 6,831,344 B2
(45) Date of Patent: Dec. 14, 2004

(54) PHOTO DETECT ELEMENT AND AN OPTICAL SEMICONDUCTOR DEVICE

(75) Inventors: Isao Ogawa, Fukuoka-ken (JP); Takashi Iwasaki, Fukuoka-ken (JP); Yoshitsugu Fujino, Yamaguchi-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 10/401,512

(22) Filed: Mar. 28, 2003

(65) Prior Publication Data

US 2003/0218175 A1 Nov. 27, 2003

(30) Foreign Application Priority Data

Mar. 29, 2002 (JP) ................................. P2002-097046
Mar. 7, 2003 (JP) ................................. P2003-061521

(51) Int. Cl.$^7$ ............................................. H01I 21/075
(52) U.S. Cl. ........................................ 257/458; 257/463
(58) Field of Search ............................... 257/458, 463, 257/444; 438/57

(56) References Cited

U.S. PATENT DOCUMENTS

| | | | | |
|---|---|---|---|---|
| 4,046,609 A | * | 9/1977 | Digoy | 438/57 |
| 4,529,947 A | * | 7/1985 | Biard et al. | 330/259 |
| 5,402,109 A | * | 3/1995 | Mannik | 340/575 |
| 6,629,638 B1 | * | 10/2003 | Sanchez | 235/454 |

FOREIGN PATENT DOCUMENTS

JP  2002-134780  5/2002

* cited by examiner

Primary Examiner—Long Pham
Assistant Examiner—Hoa B. Trinh
(74) Attorney, Agent, or Firm—Hogan & Hartson, LLP

(57) ABSTRACT

An optical semiconductor device of the present invention is equipped with a photo detect element 10 comprising a photo detect part 7 provided with two photodiodes having two photodiodes having peak wavelength sensitivity in a visible light region and an infrared region, respectively and an amplifying operation processing circuit 8 for amplifying and processing outputs of the photodiodes, and characterized in that substrate resistivity R is as follows:

$1 \leq R \leq 3 (\Omega cm)$

12 Claims, 12 Drawing Sheets

PHOTO DETECT ELEMENT AND AN OPTICAL SEMICONDUCTOR DEVICE

CROSS REFERENCE TO RELATED APPLICATION

This application is based upon and claims the benefit of priority from the prior Japanese Patent Applications No. 2002-97046, filed on Mar. 29, 2002: the entire contents of which are incorporated herein by reference.

BACKGROUND OF TIE INVENTION

1. Field of the Invention

The present invention relates to a photo detect element and an optical semiconductor device and, more particularly, to an optical semiconductor device that is used in so-called visual sensitivity and luminous intensity measurement etc. for measuring luminous intensity by sensing visible light only.

2. Description of Related Art

In recent years, in optical semiconductor devices that are used for visual sensitivity and luminous intensity measurement, a single chipped photo detect element comprising photo diodes (hereafter, referred to as PD) and an amplifying operation processing circuit to perform the amplification and processing of optical signals from PD are used. As shown in FIG. 1, an n-type region 2 is formed on the surface of a p-type silicon substrate 1 and a p-type region 3 is formed on the surface of this n-type region 2. At two PN junctions formed in the vertical direction, two PD ($PD_1$4, $PD_2$5) are formed.

An optical absorption rate on Si wafer varies depending on a depth from the surface and this optical absorption depth dependency differs depending on a wavelength, as shown FIG. 9. As the distances of above-mentioned two PN junctions from the surface of the substrate are different, the spectral response characteristic differs for each PD, for example, as shown in FIG. 3. The photodiode PD1 has the maximum sensitivity at around a wavelength 600 nm and the photodiode $PD_2$ at the position deeper than the photodiode $PD_1$ has the maximum sensitivity at around a wavelength 900 nm in FIG. 3.

Thus, a predetermined sensibility; that is, visual sensitivity can be obtained by a photo detect element by processing outputs from the diodes $PD_1$ and $PD_2$ that have different spectral response characteristics through the amplifying operation processing circuit. The luminous intensity corresponding to the spectral luminous efficiency is measured by eliminating the infrared component of the output of the photodiode $PD_1$ using the infrared component of the output of the $PD_2$.

A photo detect element 10 having such characteristic as this is mounted on a glass epoxy resin (hereinafter referred to as Glass-Epoxy) made substrate and the like, cured and bonded thereon, as shown in FIGS. 10A–10D, and FIG. 11. After bonding the terminals of the photo detect element with gold wires, an enclosure is formed and separated after transfer molded by a transparent epoxy resin 14 in order to protect the photo detect element 10. Then, the photo detect element 10 is connected to an external circuit in a metallized portion 16.

BRIEF SUMMARY OF THE INVENTION

In such the optical semiconductor device, carriers are generated by infrared ray incoming from the side of the photo semiconductor unit and a dicing face of the photo detect element, infrared ray near 1000 nm turned around in the photo detect element. As a result, the photo detect element gets a sub-peak of unnecessary infrared component of 900–1200 nm (centering around 1000 nm) in addition to a peak of visual sensitivity (550 nm) as shown in FIG. 8. That is, as a conventional optical semiconductor device detects unnecessary infrared component, the illumination intensity corresponding to spectral luminance efficiency could not be made.

That is, as an optical semiconductor device used for detecting spectral luminance efficiency, a defect is produced as a peak is detected in the infrared region. For example, when two light sources are set at the same luminous intensity, there is originally no difference in optical output current values and a light source ratio (A light source/fluorescent lamp) is one time. However, an optical semiconductor device having a characteristic to sense a sub-peak of a visual sensitivity in the above-mentioned infrared region senses the infrared region and when components of the infrared region of A light source are sensed, an output current value increases and a light source ratio becomes worse. Further, when flat and reflective materials (for example, white glass epoxy resin plate, etc.) are used for a substrate to install a photo detect element, the infrared component region is also reflected by the reflection of light from the substrate and the light source ratio is made further worse.

As explained in the above, a conventional optical semiconductor device has a sensing character in the infrared region and therefore, there was such a problem that the output also depends on infrared ray when a optical semiconductor device is used for visual sensing of luminous intensity.

Therefore, an object of the present invention is to provide an optical semiconductor device with its spectral sensitivity characteristic controlled more precisely by suppressing the sensitivity in an infrared region with such a defect of a conventional optical semiconductor device removed.

The optical semiconductor device of the present invention is characterized in that an n-type region is formed on a p-type substrate, a p-type region is formed on the surface of this n-type region, a photo detect element equipped with a first photo diode having peak wavelength sensitivity in a visible spectral region is provided on the interface between the n-type region and the p-type region, a second photo diode having peak wavelength sensitivity in the infrared region is provided on the interface between the p-type substrate and the n-type region, and specific resistance R of the p-type substrate is $1 \leq R \leq 3(\Omega cm)$.

DETAILED DESCRIPTION OF THE INVENTION

An embodiment of the present invention will be described below in detail referring to FIG. 1 through FIG. 8.

Figure 1:
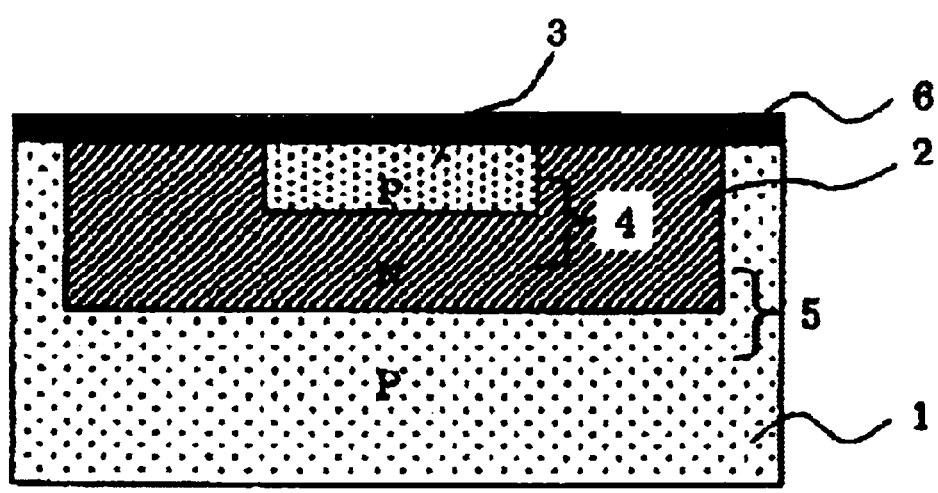
FIG. 1 is a cross-sectional view showing $PD_1$, $PD_2$ used in en embodiment of the present invention.
Figure 2:
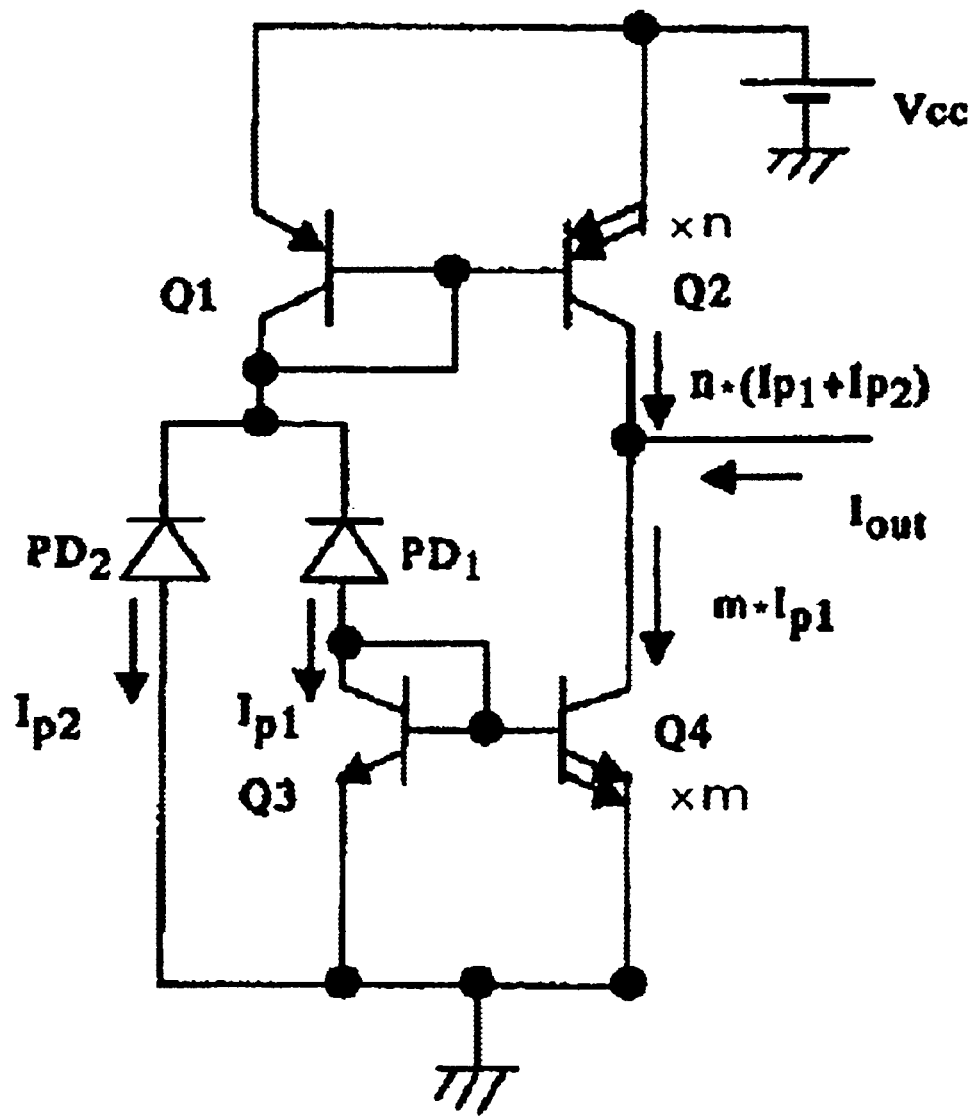
FIG. 2 is a circuit diagram of an photo detect element used in an embodiment of the present invention.
Figure 3:
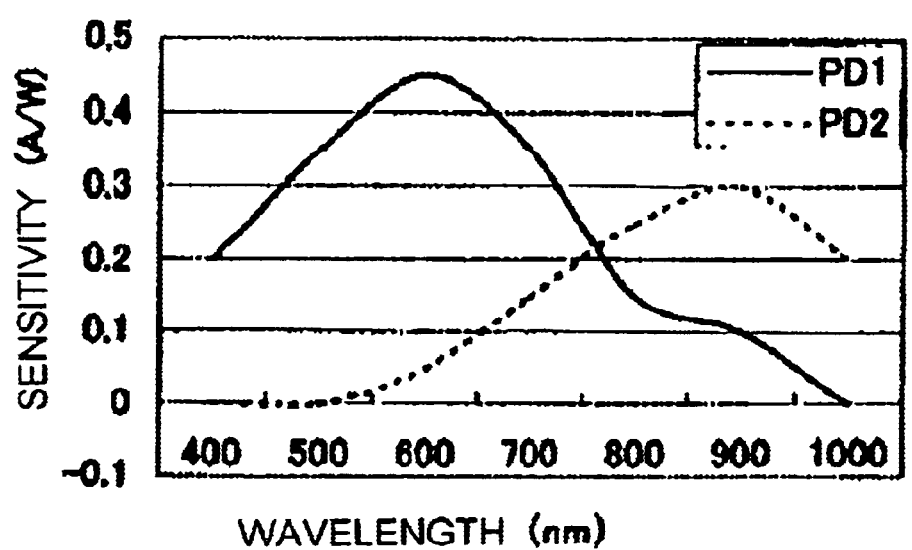
FIG. 3 is a diagram showing the spectral sensitivity characteristics of $PD_1$, and $PD_2$ used in an embodiment of the present invention.

As shown in FIG. 1, an n-type region 2 and a p-type region 3 are formed on the surface of a p-type silicon substrate 1 and a photo acceptance portion having $PD_1$ 4 and $PD_2$ 5 is formed. Further, a filter 6 is formed on the surface An amplifying and an arithmetic circuit is formed with this photo acceptance portion. As shown in FIG. 2, in this operational amplifier, the $PD_1$ and $PD_2$ of the photo detect element convert photo signals into electric signals $PD_1$, $PD_2$, which are then output through an initial stage amplifier, a differential circuit, an arithmetic circuit and an amplifier. Further, the spectral sensitivity characteristic of $PD_1$ and $PD_2$ is the same as before as shown in FIG. 3.

Figure 4:
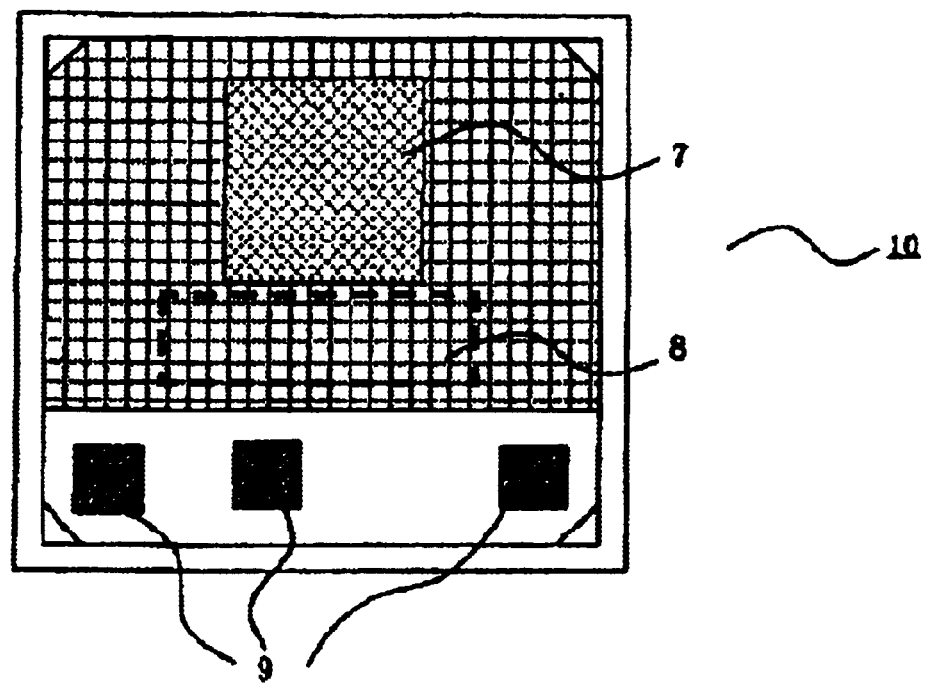
FIG. 4 is a top view of an example of a photo detect element used in an embodiment of the present invention viewed from the above.

Then, a photo detect element 10 is formed by arranging a photo detect part 7, an amplifying operation processing circuit 8, a bonding pad 9 and diced as shown in FIG. 4. Then, the photo detect element 10 is mounted on a mount bed 12 and terminals of the photo detect element 10 are bonded to a metallic lead frame 11 with a gold wire 13 shown in an external view in FIG. 8A and FIG. 8B, a plan view and a cross-sectional view in FIG. 6A and FIG. 6B. Thereafter, an enclosure is molded and formed by an transparent epoxy resin 14 to protect the photo detect element 10 and an optical semiconductor device is formed and connected to an external circuit at the outer lead portion of the exposed metallic lead frame 11.

In such the optical semiconductor device, when the output current by $PD_1$, $PD_2$ are $IP_1$, $IP_2$ and processed through the amplifying operation processing circuit, the entire output current Iout becomes as shown below:

$$Iout = mXIp_1 - nX(Ip_1 + Ip_2).$$

That is, $$Iout = \beta(Ip_1 - \alpha Ip_2).$$

α: Coefficient of subtraction factor (n/(m−n))
β: Coefficient of amplification (m−n) Further, coefficient of amplification β is a value set by a demanded output current value. A photo detect space S of the photo detect part is 0.1225 mm² (0.35 mm square).

With regard to Package A of an optical semiconductor device that is formed as described above and Package B that is formed with a similar photo detect element mounted on a glass epoxy substrate and transfer molded, a luminous source ratio when a coefficient of subtraction factor and a resistivity of a p-type silicon substrate were changed and peak relative strength of infrared component to peak strength are obtained as shown in Table 1.

TABLE 1

| # | Package | Resistivity (Ω cm) | α | luminous source ratio | infrared component |
|---|---------|--------------------|------|-----------------------|--------------------|
| 1 | A       | 2~3                | 0.3  | 1~1.5                 | 5%                 |
| 2 |         |                    | 0.55 | 0.9~1.2               | 5%                 |
| 3 |         |                    | 1    | 2~4                   | 10%                |
| 4 |         | 4~6                | 0.3  | 1.5~2                 | 20%                |
| 5 | B       | 2~3                | 0.3  | 1.5~2                 | 30%                |
| 6 |         |                    | 1    | 2~4                   | 30%                |
| 7 |         | 4~6                | 0.3  | 2~3                   | 50%                |
| 8 |         |                    | 1    | 3~6                   | 50%                |

So far, a coefficient of subtraction magnification α was not taken into consideration. That is, α=1 and it was seen that it becomes possible to reduce a luminous source ratio and infrared component when the coefficient of subtraction magnification a is set in the following range.

$$0.3 \leq \alpha \leq 0.55$$

Further, the range of this coefficient of subtraction magnification αis especially effective when the photo detecting space C is below 0.25 and is $$0.0765 \leq S \leq 0.1225 (mm^2)$$

Further, in an effort to improve reliability of an optical semiconductor device and extend its life, a p-type substrate having a high resistivity of 4~6 Ωcm was so far used for substrate of photo detect element. However, it is seen that it becomes possible to reduce a light source ratio and infrared component by controlling the number of lattice defects of p-type substrate and using substrate having a low resistivity of 2~3 Ωcm inversely in this embodiment. This is considered because when substrate resistivity R becomes low, spectral sensitivity characteristic shifts to higher energy of photon than absorption band gap, that is, to the short wavelength side at lower substrate resistivity R.

Further, the more low the substrate resistivity R is, the more preferable in order to reduce light source ratio and infrared component. However, when substrate resistivity R is less than 1 Ωcm, it does not function as PD. On the other hand, over 3 Ωcm, a sufficient effect cannot be obtained and 1~3 Ωcm is adequate. Further, a desired value of substrate resistivity can be obtained by adjusting the doping amount of p-type impurity.

Figure 5A:
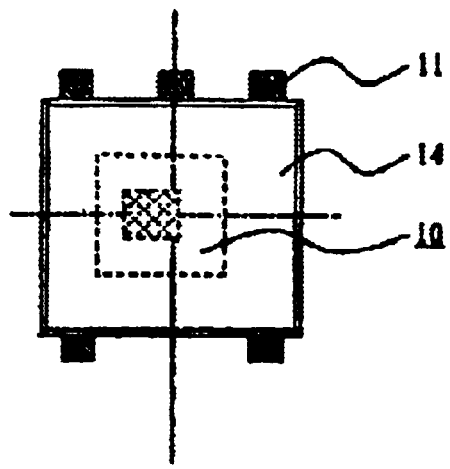
FIG. 5A~FIG. 5D are diagrams showing the construction of a opt semiconductor device in an embodiment of an present invention.
Figure 5B:
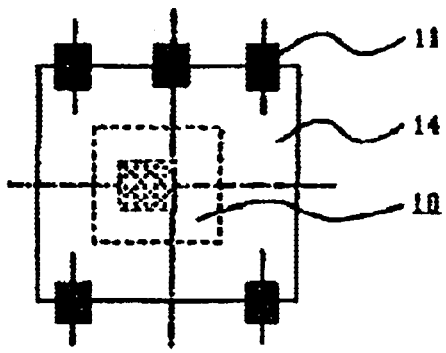
Figure 5C:
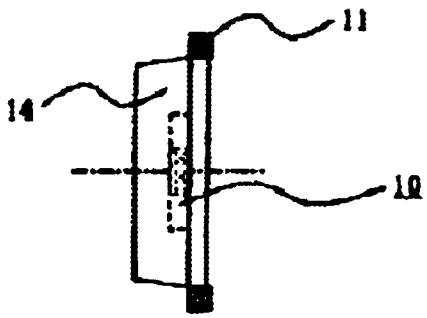
Figure 5D:
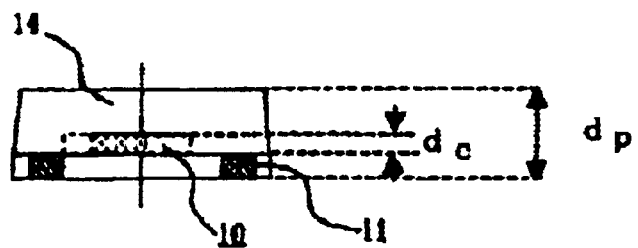

Further, with regard to an optical semiconductor device similarly formed, a light source ratio and relative strength of infrared component when a chip thickness dc of a photo detect element shown in FIG. 5D were obtained as shown in Table 2. Further, a package thickness dp of an optical semiconductor device is 0.7 mm and a metallic lead frame in 0.1~0.15 mm thick is used.

TABLE 2

| # | package | Resistivity (Ω cm) | α | chip thickness dp (mm) | luminous source ratio | infrared component |
|---|---------|-------------------|------|------------------------|----------------------|---------------------|
| 9 | A | 2~3 | 0.55 | 0.1 | 0.85~1.1 | 3% |
| 10 | | | | 0.15 | 0.9~1.2 | 5% |
| 11 | | | | 0.2 | 1~1.5 | 8% |
| 12 | | | | 0.3 | 1~1.5 | 10% |
| 13 | B | | 0.3 | 0.3 | 1.5~2 | 30% |

So far, the chip thickness dp of the photo detect element was made to 0.3 mm by lapping. Chip thickness dc/package thickness dp (chip thickness ratio) was 40~55% for the package thickness dp about 0.55~0.7 mm of an optical semiconductor device. However, it is seen that slight source ratio and infrared component can be reduced by reducing the chip thickness dc to 0.2 mm or below (0.05 mm or more is realistic). The chip thickness ratio (dc/dp) below 0.25 is good (0.07 or more is realistic) and 0.2 or below is preferable.

When the chip thickness ratio (dc/dp) is made to 0.25 or below, generation of crack by coefficient of expansion of the transparent epoxy resin 14, the photo detect element 10 and the metallic lead frame 11 can be prevented.

Further, with regard to an optical semiconductor device (Package A) that is similarly formed, light source ratio and relative strength of infrared component when a mount bed size of a metallic lead frame on which the photo detect element is installed were changed are obtained with the results as shown in Table 3.

Figure 6A:
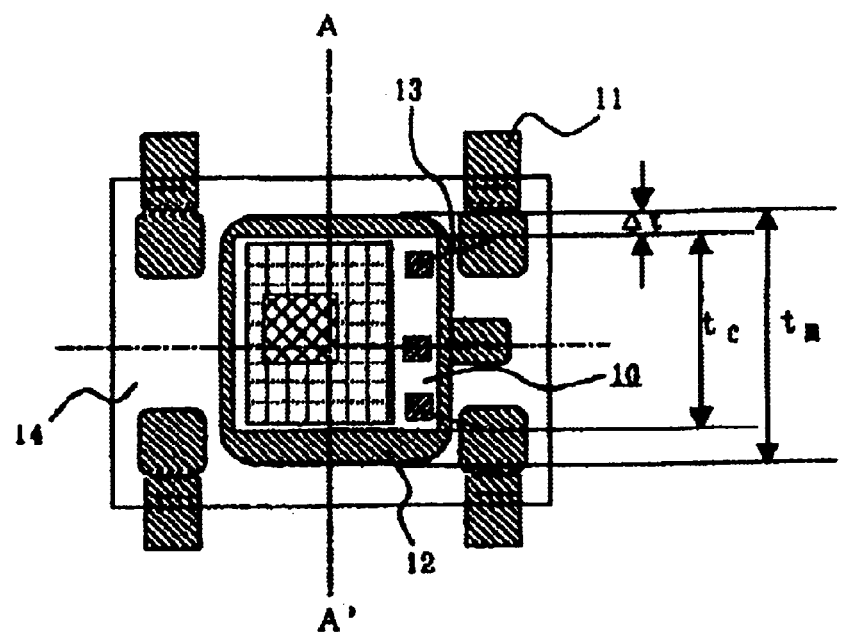
FIG. 6A and FIG. 6B are a plan view and a cross-sectional view of an optical semiconductor device in an embodiment of the present invention.
Figure 6B:
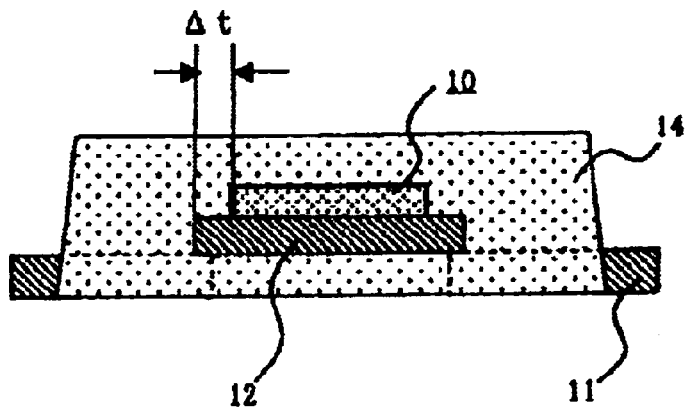

Here, the mount bed is a portion of the lead frame on which a photo detect element is mounted. As shown in FIG. 6A and FIG. 6B that is equivalent to the cross sectional diagram of Section A—A in FIG. 6A, what is equivalent to the length of one side is substantially a mount bed size tm. Further, when a chip size is tc, $\Delta t$ is given by the following formula:

$$\Delta t = (tm - tc)/2$$

$\Delta t$ is equivalent to a distance between the edge of the mount bed 12 when the photo detect element 10 is mounted at the center of the mount bed 12 and the edge of the photo detect element 10. Further, when $\Delta t$ differs depending on a position, its maximum value is made as $\Delta t$. The chip size tc is 1.1 mm.

TABLE 3

| # | tm (mm) | Δt (mm) | luminous source ratio | infrared component |
|---|---------|---------|----------------------|---------------------|
| 14 | 1.1 | 0 | 0.9~1.3 | 3% |
| 15 | 1.2 | 0.05 | 0.9~1.3 | 5% |
| 16 | 1.3 | 0.1 | 1~1.5 | 8% |
| 17 | 1.4 | 0.15 | 2~3 | 10% |
| 18 | 1.5 | 0.2 | 2~3 | 12% |

Thus, it can be seen that light source ratio and infrared component can be suppressed by reducing $\Delta t$ to below 0.1 mm. This is because the reflection of light including infrared component from the mount bed is suppressed, and it is ideal to make the chip size tc equal to the mount bed size tm. Further, it is preferred not to mount anything reflecting light in a range within 0.1 mm around the mount bed 12.

Further, the mount bed 12 is made here as the photo detect element mounting part of the metallic lead frame 11. This is also the same on ball Grid Array (BGA) substrate, etc. and it is effective to suppress the distance from the photo detect element to the mount bed edge similarly. At this time, it is necessary to make regions other than the mount bed 12 of the substrate using material and color (black) not reflecting light.

Further, in this embodiment, a case wherein the chip size tc is below 1.1 mm is described. However, even when it is below 1.1 mm, if $\Delta t$ is below 0.1 mm, it is possible to reduce infrared component sufficiently. However, when $\Delta t = 0.1$ mm or below, it is needless to say that infrared component can be reduced relatively in a large chip size.

Figure 7A:
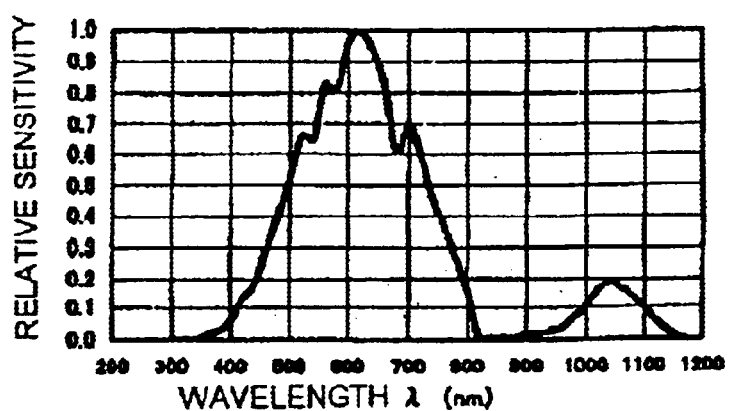
FIG. 7A and FIG. 7B are diagrams showing the spectral sensitivity characteristic of an optical semiconductor device in an embodiment of the present invention.
Figure 7B:
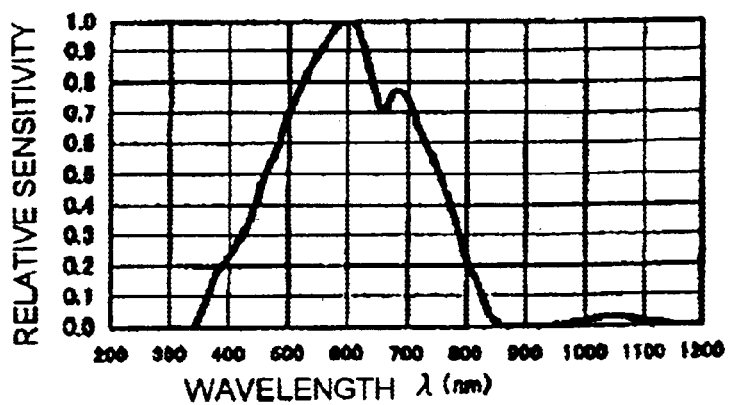
Figure 8:
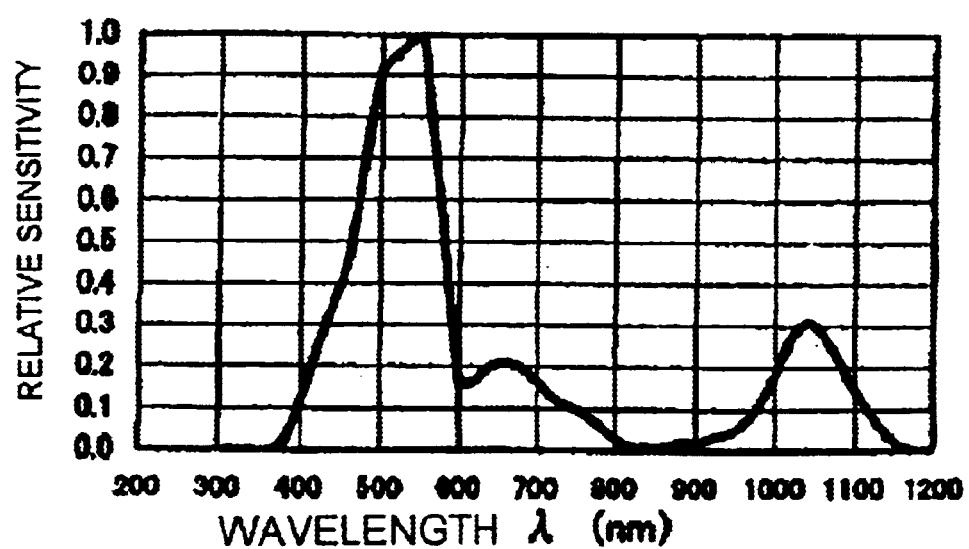
FIG. 8 is a diagram showing the spectral sensitivity characteristic of a conventional optical semiconductor device.
Figure 9:
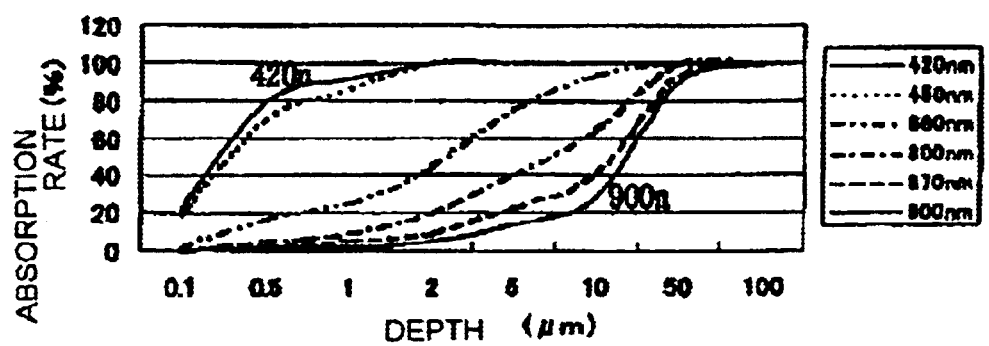
FIG. 9 is a diagram showing the depth dependency of optical absorption in Si wafer.
Figure 10A:
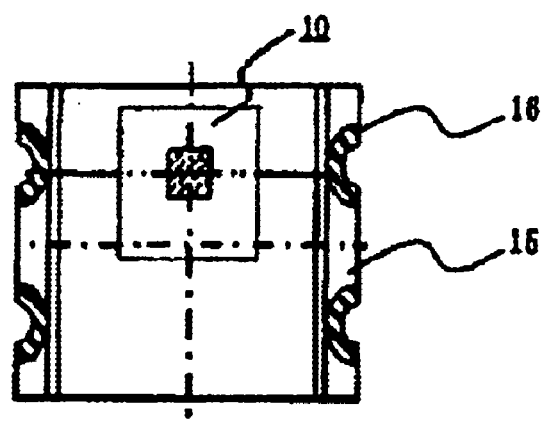
FIG. 10A~FIG. 10B are diagrams showing a conventional optical semiconductor device.
Figure 10B:
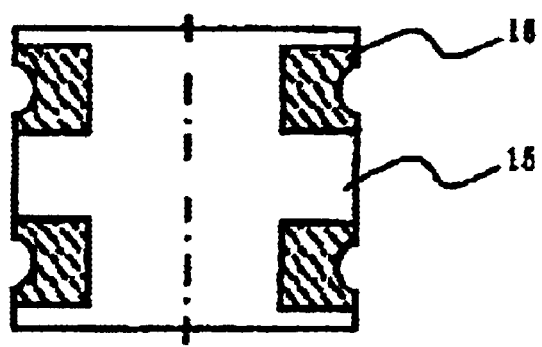
Figure 10C:
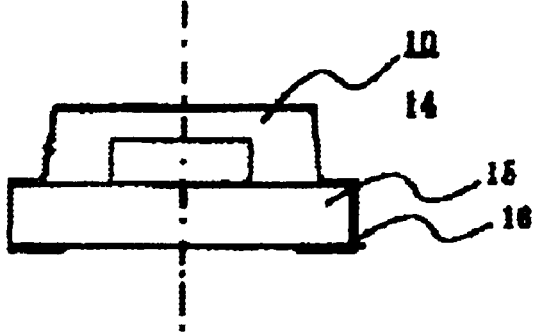
Figure 10D:
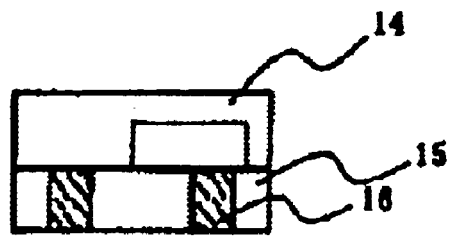
Figure 11:
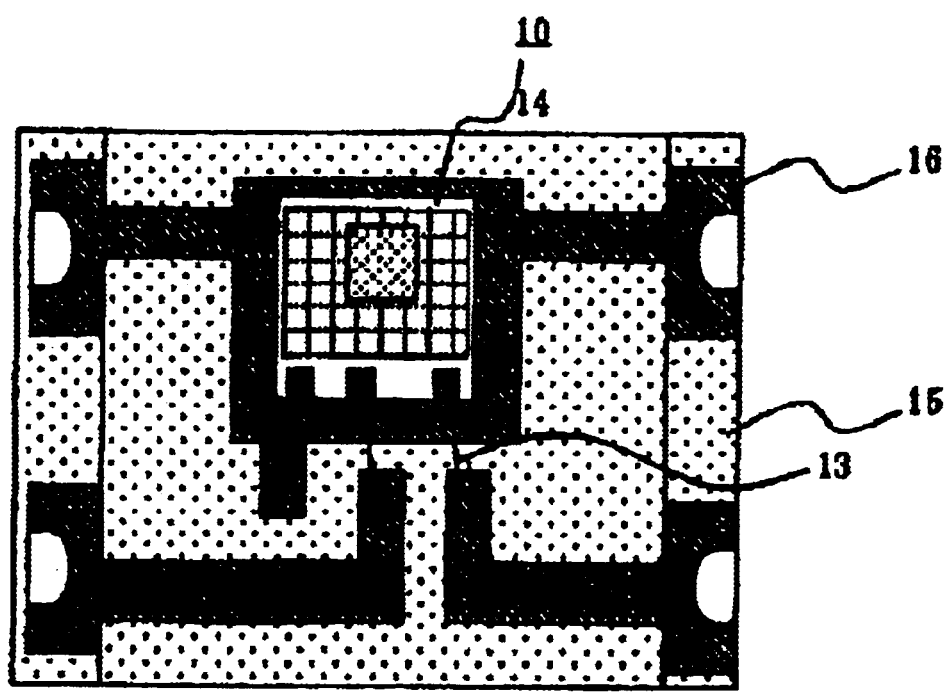
FIG. 11 is a diagram showing a conventional optical semiconductor device.

Further, the spectral responsibility was measured on optical semiconductor devices formed as described above with the results shown in FIG. 7A and FIG. 7B. Further, FIG. 7A is a spectral sensitivity characteristic diagram showing relative sensitivity of Package B with a low substrate resistivity R (2~3 Ωcm) and an optimized coefficient of subtraction magnification α to wavelengths. FIG. 7B is a spectral sensitivity characteristic diagram showing relative sensitivity of an improved Package A with optimized chip thickness ratio and $\Delta t$.

It is seen that the spectral sensitivity characteristic shown in FIG. 7A and FIG. 7B is sharply improved when compared with the spectral sensitivity characteristic of a conventional optical semiconductor device (Package B of α=1, high substrate resistivity). In particular, a good spectral sensitivity characteristic with almost less sensitivity in the infrared region is obtained in FIG. 7B. Also in FIG. 7A, a good spectral sensitivity characteristic was obtained though certain sensitivity was left in the infrared region and it is seen that the optimization of parameters is also effective in Package B.

In addition, in Package B, a printing substrate needs to make it the quality of the material which does not reflect light, and a color (black).

Further, in the construction diagram of the photo detect part shown in FIG. 1, when the filter 6 having the characteristic to shut off infrared components is used, the sensitivity in the infrared region can be further reduced and an optical semiconductor device having more high precisely controlled spectral sensitivity characteristic can be obtained.

The filter 6 is formed by laminating, for example, a thin film of titanium dioxide ($TiO_2$) having a high refractive index and a thin film of silicon dioxide ($SiO_2$) alternately. The thin film titanium dioxide and thin film silicon dioxide are, for example, 0.24 μm thick and laminated by, for example, deposition for every 75 layers to a filter of total 150 layers and total thickness 36 μm.

Deposition conditions when laminating titanium dioxide and silicon dioxide by deposing are, for example, degree of vacuum is 1 Pa~$2 \times 10^{-4}$ Pa, substrate temperature 120~350° C., and resistance heating or an electron gun is used.

Further, the total number of films that are laminated for the filter 6 is selected in a range of about 50~150 layers. A filter in this laminated structure is formed by deposition directly on the photo detect part.

Figure 12:
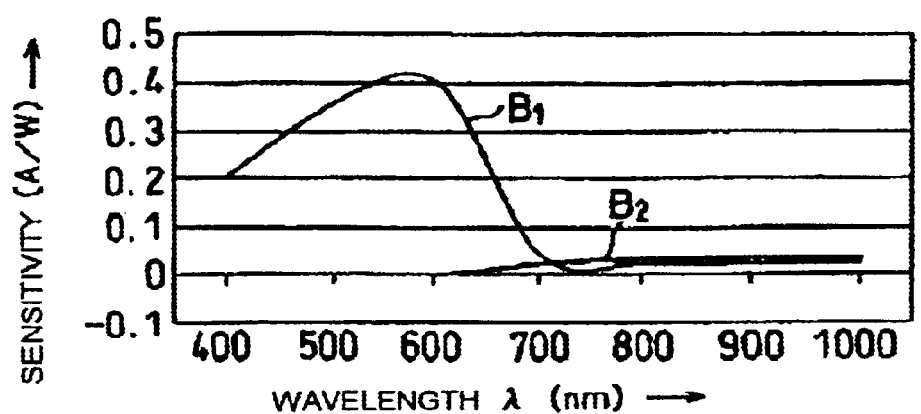
FIG. 12 is a diagram showing a spectral sensitivity characteristic of the photodiodes $PD_1$, $PD_2$ when a filter provided in the photo acceptance portion is in the thin film laminated structure in an embodiment of the present invention.

Spectral sensitivity characteristic by photodiodes $PD_1$ and $PD_2$ when the photo detect part has a filter in the laminated structure formed as described above is shown in FIG. 12. The characteristic of the photodiode $PD_1$ is $B_1$ and the characteristic of the photodiode $PD_2$ is $B_2$. When these characteristics $B_1$, $B_2$ are compared with the characteristic shown in FIG. 3, it is seen that when a filter in the laminated structure is used, the wavelength is around 650 nm or above and spectral sensitivity was lowered and spectral sensitivity at a wavelength above 800 nm is nearly zero and almost constant.

As described above, when a filter with thin films having different refraction factors laminated alternately is directly provided to the photo detect part, a further good spectral sensitivity characteristic can be obtained irrespective of incident range of light.

When this filter in laminated structure is provided to the photo detect part by the deposition, there is the less possibility of separation by heat generated when soldered or secular change of the fixed portion even when the filter is mounted on the surface of a wiring substrate, etc. by the reflow soldering and a highly reliable optical semiconductor device is obtained.

According to the present invention, it is possible to provide an optical semiconductor device having the suppressed sensitivity in the infrared region and a high precisely controlled spectral sensitivity character.

What is claimed is:

1. A photo detect element comprising:
   a first photodiode having peak wavelength sensitivity in a visible light region;
   a second photodiode having peak wavelength sensitivity in an infrared region;
   wherein said first photodiode comprises a p-type substrate and a n-type region on said p-type substrate, and
   said second photodiode comprises said n-type region and said p-type region on said n-type region, and
   resistivity R of said p-type substrate is as follow:

$1 \leq R \leq 3 (\Omega cm)$.

2. A photo detect element according to claim 1, wherein when a thickness of said optical semiconductor device is assumed to be dc, $dc \leq 0.2$ mm is satisfied.

3. An optical semiconductor device comprising:
   a photo detect element equipped with a first photodiode having peak wave length sensitivity in a visible light region and a second photodiode having peak wavelength sensitivity in an infrared region;
   a package covering said photo detect element;
   wherein when a thickness ratio of the optical semiconductor dc/a thickness of the package dp $dc/dp \leq 0.25$ is satisfied.

4. An optical semiconductor device comprising:
   a photo detect element equipped with a first photodiode having peak wave length sensitivity in a visible light region and a second photodiode having peak wavelength sensitivity in an infrared region;
   a mount bed with a transparent resin portion covering the photo detect element and the photo detect element mounted thereon; and
   a means for connecting to an external circuit,
   and when the mount bed size is tm and the size of the photo detect element is tc and when $\Delta t = (tm - tc)/2$ $0 \leq \Delta t \leq 0.1 (mm)$ is satisfied.

5. An optical semiconductor device comprising:
   a photo detect element equipped with a first photodiode having peak wavelength sensitivity in a visible light region and a second photodiode having peak wavelength sensitivity in an infrared region; and
   an amplifying operation processing circuit for processing and outputting an output current $IP_1$ from said first photodiode and an output current $IP_2$ from said second photo diode; and
   wherein when $\alpha$ is assumed to be a coefficient of subtraction magnification and $\beta$ is assumed to be a coefficient of amplification, an output Iout from said amplifying operation processing circuit obtained by the following formula, $Iout = \beta(IP_1 - \alpha IP_2)$ $0.3 \leq \alpha \leq 0.55$.

6. An optical semiconductor device according to claim 3 or 4,
   wherein a space S of a photo detecting part is as follows:

$S \leq 0.25$ mm².

7. An optical semiconductor device comprising:
   a photo detect element equipped with a first photodiode having peak wave length sensitivity in a visible light region and a second photodiode having peak wavelength sensitivity in an infrared region;
   a package covering said photo detect element; and
   a filter formed on said photo detect element by laminating plural kinds of films having different refraction factors by deposition,
   wherein said first photodiode comprises a p-type substrate and a n-type region on said p-type substrate, and said second photodiode comprises said n-type region and said p-type region on said n-type region, and
   a resistivity R of said p-type substrate is as follows:

$1 \leq R \leq 3 (\Omega cm)$.

8. An optical semiconductor device according to claim 7, wherein $dc \leq 0.2$ mm when a thickness of a photo detect element is dc.

9. An optical semiconductor device according to claim 8, wherein the following formula is satisfied when a thickness of the package is dp:

$dc/dp \leq 0.25$.

10. An optical semiconductor device according to claim 9, wherein the filter is formed by laminating titanium dioxide ($TiO_2$) thin films and silicon dioxide ($SiO_2$) thin films alternately.

11. An optical semiconductor device comprising:
    a photo detect element equipped with a first photodiode having peak wavelength sensitivity in a visible light region and a second photodiode having peak wavelength sensitivity in an infrared region; and
    an amplifying operation processing circuit for processing and outputting an output current $Ip_1$ from said first photodiode and an output current $IP_2$ from said second photodiode;
    a filter formed on said photo detect element by laminating plural kinds of films having different refraction factors by deposition; and wherein when α is assumed to be a coefficient of subtraction magnification and β is assumed to be a coefficient of amplification is, an output Iout from said amplifying operation processing circuit obtained by the following formula, $Iout = \beta(Ip_1 - \alpha Ip_2)$ $0.3 \leq \alpha \leq 0.55$.

12. An optical semiconductor device according to claim 11, wherein said filter is formed by laminating thin films of titanium dioxide ($TiO_2$) and silicon dioxide ($SiO_2$) alternately.

* * * * *